US012615833B2

(12) United States Patent
Watanabe

(10) Patent No.: US 12,615,833 B2
(45) Date of Patent: Apr. 28, 2026

(54) TRANSISTOR

(71) Applicant: Mitsubishi Electric Corporation, Tokyo (JP)

(72) Inventor: Shinsuke Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 654 days.

(21) Appl. No.: 18/004,832

(22) PCT Filed: Nov. 16, 2020

(86) PCT No.: PCT/JP2020/042653
§ 371 (c)(1),
(2) Date: Jan. 9, 2023

(87) PCT Pub. No.: WO2022/102137
PCT Pub. Date: May 19, 2022

(65) Prior Publication Data
US 2023/0307517 A1 Sep. 28, 2023

(51) Int. Cl.
*H01L 23/66* (2006.01)
*H01L 23/48* (2006.01)
(Continued)

(52) U.S. Cl.
CPC ......... *H10D 64/257* (2025.01); *H01L 23/481* (2013.01); *H01L 23/66* (2013.01);
(Continued)

(58) Field of Classification Search
CPC .. H10D 30/475; H10D 30/4755; H10D 30/47; H10D 30/471; H10D 30/472;
(Continued)

(56) References Cited

U.S. PATENT DOCUMENTS 5,874,763 A * 2/1999 Ham ................... H10D 89/811
257/355
6,424,006 B1 * 7/2002 Ponse ................. H10D 64/254
257/341
(Continued)

FOREIGN PATENT DOCUMENTS

JP H07-074185 A 3/1995
JP 2010-123652 A 6/2010
JP 6067151 B2 1/2017

OTHER PUBLICATIONS

International Search Report issued in PCT/JP2020/042653; mailed Feb. 9, 2021.

*Primary Examiner* — Eric A. Ward
(74) *Attorney, Agent, or Firm* — Studebaker Brackett PLLC

(57) ABSTRACT

A transistor according to the disclosure includes a semiconductor substrate, a source pad provided on an upper surface of the semiconductor substrate, a plurality of source electrodes provided on the upper surface of the semiconductor substrate and arranged in an arrangement direction, the plurality of source electrodes each including a first end connected to the source pad and a second end on a side opposite to the source pad, a plurality of drain electrodes arranged alternately with the plurality of source electrodes in the arrangement direction, a gate electrode and a first wire configured to connect the second ends of a plurality of central electrodes provided at a central part of the semiconductor substrate in the arrangement direction among the plurality of source electrodes, and not to connect the second ends of the source electrodes other than the plurality of central electrodes.

14 Claims, 11 Drawing Sheets

(51) Int. Cl.

| | | |
|---|---|---|
| *H10D 64/23* | (2025.01) | |
| *H10D 30/47* | (2025.01) | |
| *H10D 62/85* | (2025.01) | |

(52) U.S. Cl.
CPC ................. *H01L 2223/6611* (2013.01); *H01L 2223/6622* (2013.01); *H01L 2223/6688* (2013.01); *H10D 30/475* (2025.01); *H10D 62/8503* (2025.01)

(58) Field of Classification Search
CPC ............. H10D 30/473; H10D 30/4732; H10D 30/4735; H10D 30/4738; H10D 30/474; H10D 30/477; H10D 30/478; H10D 62/126; H10D 62/127; H10D 62/8503; H10D 64/257; H10D 64/411; H10D 64/511; H10D 64/517; H10D 64/518; H10D 64/519; H10D 64/254; H10D 64/258; H10D 64/259; H10D 84/811
See application file for complete search history.

(56) References Cited

U.S. PATENT DOCUMENTS

| 2008/0067563 | A1* | 3/2008 | Kawasaki | ............ H10D 64/519 257/E29.345 |
|---|---|---|---|---|
| 2014/0034971 | A1* | 2/2014 | Ishikura | ................. H10D 30/01 257/77 |
| 2015/0311332 | A1* | 10/2015 | Zhang | ................... H01L 21/283 438/172 |
| 2017/0317012 | A1 | 11/2017 | Imai et al. | |
| 2021/0280508 | A1* | 9/2021 | Sueyama | ............... H10D 30/60 |

\* cited by examiner

FIRST DIRECTION

FIG.8

| SOURCE END CONNECTION | V/H CONNECTION AT BOTH CHIP ENDS | RESONANCE FREQUENCY |
|---|---|---|
| ABSENT | DISCONNECTED | 28. 3 GHz |
| ALL | DISCONNECTED | 46. 2 GHz |
| ALL | CONNECTED | 46. 2 GHz |
| CHIP CENTRAL PART | DISCONNECTED | 34. 5 GHz |
| ABSENT | CONNECTED | 32. 1 GHz |
| CHIP CENTRAL PART | CONNECTED | 39. 9 GHz |

TRANSISTOR

FIELD

The present disclosure relates to a transistor.

BACKGROUND

PTL 1 discloses a multi-finger transistor. The multi-finger transistor includes a plurality of gate fingers arranged in an active region on a semiconductor substrate, and a plurality of source fingers and a plurality of drain fingers that are alternately arranged in the active region so as to sandwich the gate fingers. A gate pad is disposed outside the active region. The gate pad is connected to the gate fingers through a gate bus. A source pad is disposed in a region that is located outside the active region and on the gate pad side relative to the active region. The source pad is connected to the source fingers. A drain pad is disposed in a region that is located outside the active region and on a side opposite to the gate pad with the active region in between. The drain pad is connected to the drain fingers. The source pad is grounded by a source via. The multi-finger transistor includes a circuit suppressing voltage current distribution in a region that is located outside the active region and on the drain pad side. The circuit connects the gate fingers or the source fingers.

CITATION LIST

Patent Literature

[PTL 1] JP 6067151 B

SUMMARY

Technical Problem

In a transistor amplifying a high-frequency signal, such as a GaN HEMT (High Electron Mobility Transistor), speed-up of operation and increase in gain are progressing. With this increase in gain, oscillation may occur in a single transistor chip when a bias voltage is just applied. In the multi-finger transistor disclosed in PTL 1, the source fingers are bundled by a source bus as a wire and are connected. Further, to avoid contact with the source bus, the drain fingers and the drain pad are connected through drain air bridges. This makes it possible to reduce the voltage current distribution occurring between the source fingers, and to suppress loop oscillation.

A parallel plate capacitor is formed at a portion where the source bus and each of the drain air bridges intersect each other. Therefore, a drain-source capacitance of the high-frequency transistor may be increased.

An object of the present disclosure is to provide a transistor that can suppress a drain-source capacitance while suppressing oscillation.

Solution to Problem

A transistor according to the first disclosure includes a semiconductor substrate, a source pad provided on an upper surface of the semiconductor substrate, a plurality of source electrodes provided on the upper surface of the semiconductor substrate and arranged in an arrangement direction parallel to the upper surface of the semiconductor substrate, the plurality of source electrodes each including a first end connected to the source pad and a second end on a side opposite to the source pad, a plurality of drain electrodes provided on the upper surface of the semiconductor substrate and arranged alternately with the plurality of source electrodes in the arrangement direction, a gate electrode provided on the upper surface of the semiconductor substrate and a first wire configured to connect the second ends of a plurality of central electrodes provided at a central part of the semiconductor substrate in the arrangement direction among the plurality of source electrodes, and not to connect the second ends of the source electrodes other than the plurality of central electrodes among the plurality of source electrodes.

A transistor according to the second disclosure includes a semiconductor substrate, a source pad provided on an upper surface of the semiconductor substrate, a plurality of source electrodes provided on the upper surface of the semiconductor substrate and arranged in an arrangement direction parallel to the upper surface of the semiconductor substrate, the plurality of source electrodes each including a first end connected to the source pad and a second end on a side opposite to the source pad, a plurality of drain electrodes provided on the upper surface of the semiconductor substrate and arranged alternately with the plurality of source electrodes in the arrangement direction, a gate electrode provided on the upper surface of the semiconductor substrate and a connection path configured to connect the second ends of paired outside electrodes provided at both ends in the arrangement direction among the plurality of source electrodes, and not to connect the second ends of the source electrodes other than the paired outside electrodes among the plurality of source electrodes.

Advantageous Effects of Invention

In the transistor according to the present disclosure, the first wire or the connection path is selectively provided at the portion strongly influencing on prevention of a standing wave. Therefore, it is possible to suppress the drain-source capacitance while suppressing oscillation.

BRIEF DESCRIPTION OF DRAWINGS

FIG. 8 is a diagram illustrating relationship between the connection state of the source electrodes and the resonance frequency.

DESCRIPTION OF EMBODIMENTS

Figure 1:
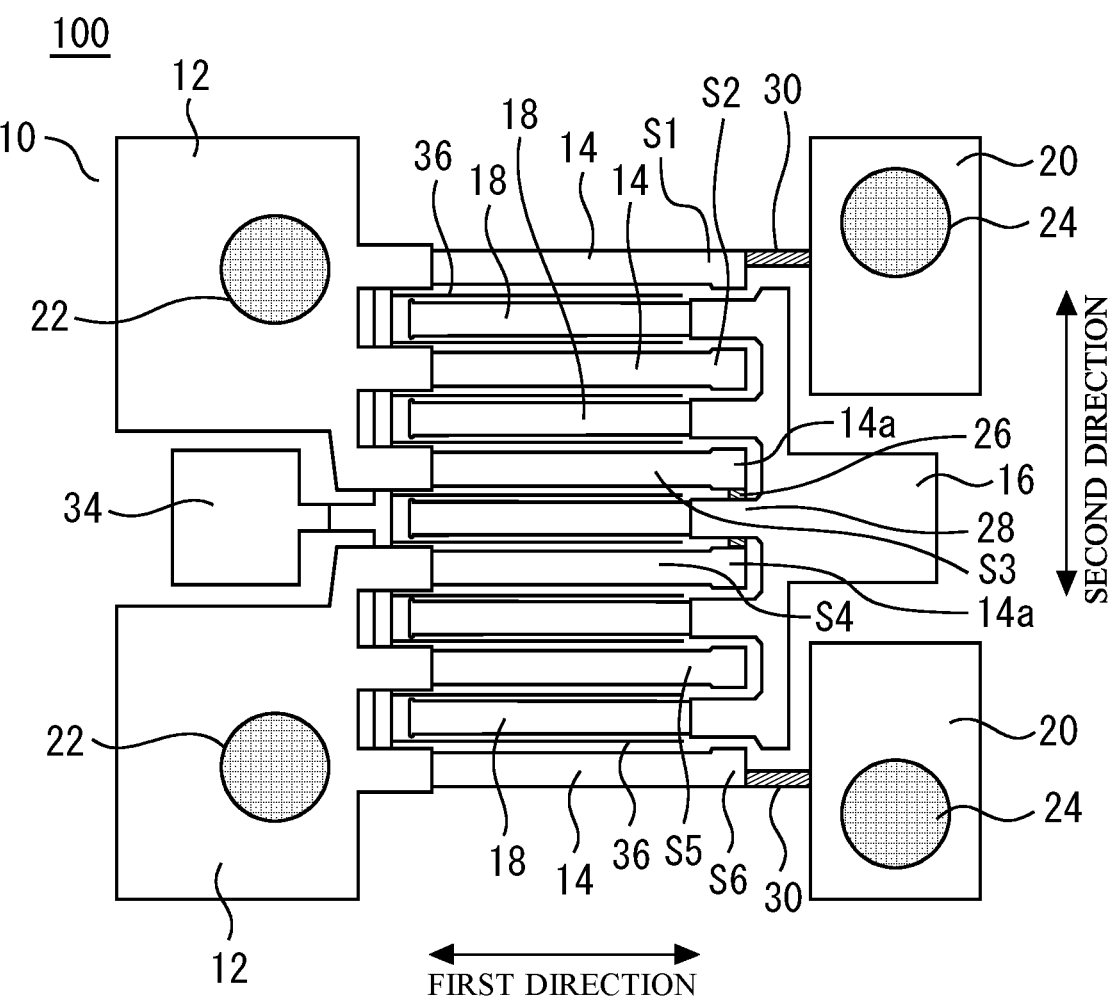
FIG. 1 is a plan view of a transistor according to Embodiment 1.

Transistors according to respective embodiments are described with reference to drawings. The same or corresponding components are denoted by the same reference numerals, and repetitive descriptions are omitted in some cases. A term connection used hereinafter includes electric connection.

Embodiment 1

FIG. 1 is a plan view of a transistor 100 according to Embodiment 1. The transistor 100 is a high-frequency transistor chip. The transistor 100 is also called a multi-finger transistor. The transistor 100 includes a semiconductor substrate 10. As a material for the semiconductor substrate 10, silicon, silicon carbide, gallium arsenide, gallium nitride, or the like is used. A high-electron-mobility transistor, a metal-oxide-semiconductor field-effect transistor, or the like is provided on the semiconductor substrate 10. Here, the high-electron-mobility transistor using a gallium nitride substrate (GaN HEMT) is used as an example.

Source pads 12, a drain pad 16, and a gate pad 34 are provided on an upper surface of the semiconductor substrate 10. The source pads 12 and the gate pad 34 are provided on one side in a first direction on the upper surface of the semiconductor substrate 10. The drain pad 16 is provided on the other side in the first direction on the upper surface of the semiconductor substrate 10. Further, electrode pads 20 are provided on the other side in the first direction on the upper surface of the semiconductor substrate 10.

The drain pad 16 and the gate pad 34 are provided to bond wires. Further, via holes 22 are provided just below the respective source pads 12. Each of the via holes 22 connects and conducts the corresponding source pad 12 and a rear surface metal provided on a rear surface on a side opposite to the upper surface of the semiconductor substrate 10. The via holes 22 are made of a metal layer provided in through holes provided in the semiconductor substrate 10. Further, via holes 24 are provided just below the respective electrode pads 20.

A plurality of source electrodes 14, a plurality of drain electrodes 18, and a plurality of gate electrodes 36 are provided in a region sandwiched between the source pads 12 and the drain pad 16 in the first direction on the upper surface of the semiconductor substrate 10. The source electrodes 14, the drain electrodes 18, and the gate electrodes 36 are also respectively called source fingers, drain fingers, and gate fingers. The source pads 12, the drain pad 16, the gate pad 34, the electrode pads 20, the source electrodes 14, the drain electrodes 18, and the gate electrodes 36 are each made of a metal.

Each of the plurality of source electrodes 14 includes a first end connected to any of the source pads 12 and a second end 14a on a side opposite to the source pads 12. The source electrodes 14 extend in the first direction. The plurality of source electrodes 14 are arranged side by side in an arrangement direction parallel to the upper surface of the semiconductor substrate 10. The arrangement direction is, for example, a second direction perpendicular to the first direction.

Each of the plurality of drain electrodes 18 includes a first end connected to the drain pad 16 and a second end on a side opposite to the drain pad 16. The drain electrodes 18 extend in the first direction. The plurality of drain electrodes 18 are arranged side by side in the arrangement direction. The plurality of drain electrodes 18 are arranged alternately with the plurality of source electrodes 14 in the arrangement direction.

Each of the plurality of gate electrodes 36 includes a first end connected to the gate pad 34 and a second end on a side opposite to the gate pad 34. The gate electrodes 36 extend in the first direction. The plurality of gate electrodes 36 are arranged side by side in the arrangement direction. Each of the plurality of gate electrodes 36 is provided between each of the source electrodes 14 and the drain electrode 18 adjacent thereto.

A wire 26 made of a metal is provided on the upper surface of the semiconductor substrate 10. The wire 26 connects the second ends 14a of a plurality of central electrodes S3 and S4 provided at a central part of the semiconductor substrate 10 in the arrangement direction, among the plurality of source electrodes 14. In the present embodiment, the plurality of central electrodes S3 and S4 are paired adjacent source electrodes 14 provided at the central part of the semiconductor substrate 10 in the arrangement direction.

As the plurality of source electrodes 14, an even number of source electrodes S1 to S6 are provided in the transistor 100. At this time, among the plurality of electrodes including the plurality of source electrodes 14, the plurality of drain electrodes 18, and the plurality of gate electrodes 36 arranged in the second direction, an electrode provided at a center is the drain electrode 18. In other words, an electrode provided on a center line of the chip extending in the first direction is the drain electrode 18. In this configuration, for example, the two source electrodes S3 and S4 sandwiching the drain electrode 18 at the center is central electrodes connected by the wire 26.

Further, the wire 26 is selectively provided so as to come into contact with only the second ends 14a of the central electrodes S3 and S4 among the plurality of source electrodes 14. In other words, the wire 26 is not connected to the second ends 14a of the source electrodes 14 other than the plurality of central electrodes S3 and S4.

Figures 2, 3:
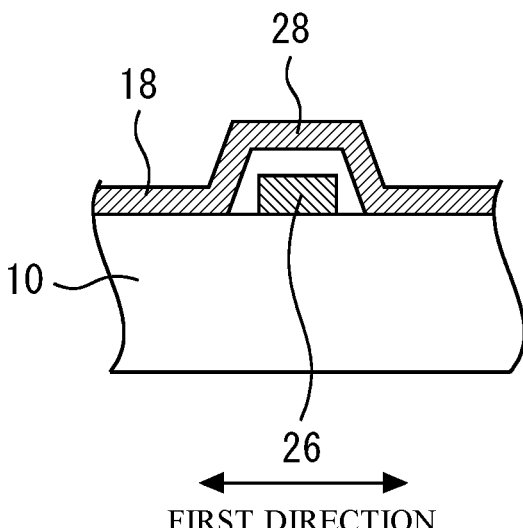
FIG. 2 is a cross-sectional view of the air bridge according to Embodiment 1.
FIG. 3 is a cross-sectional view of a via hole according to Embodiment 1.

The wire 26 intersects the drain electrode 18 provided between the plurality of central electrodes S3 and S4 in a planar view. A portion of the drain electrode 18 intersecting the wire 26 is provided with an air bridge 28. FIG. 2 is a cross-sectional view of the air bridge 28 according to Embodiment 1. The drain electrode 18 straddles the wire 26 by the air bridge 28. This enables connection of the drain electrode 18 and the drain pad 16.

FIG. 3 is a cross-sectional view of a via hole 24 according to Embodiment 1. A rear surface metal 32 is provided on the rear surface of the semiconductor substrate 10. Each of the via holes 24 penetrates the semiconductor substrate 10 from the upper surface to the rear surface. The via holes 24 are made of a metal layer provided in through holes provided in the semiconductor substrate 10. Each of the via holes 24 connects and conducts the corresponding electrode pad 20 and the rear surface metal 32. Further, the plurality of via holes 24 illustrated in FIG. 1 are connected to one another by the rear surface metal 32 on the rear surface side of the semiconductor substrate 10.

The second ends 14a of paired outside electrodes S1 and S6 provided at both ends in the arrangement direction among the plurality of source electrodes 14 are connected to the respective electrode pads 20 by wires 30 made of a metal. As a result, the second ends 14a of the paired outside electrodes S1 and S6 are connected to each other by the wires 30, the electrode pads 20, the via holes 24, and the rear surface metal 32.

In the present embodiment, a connection path connecting the second ends 14a of the paired outside electrodes S1 and S6 is configured by the wires 30, the electrode pads 20, the via holes 24, and the rear surface metal 32. Further, the connection path is not connected to the second ends 14a of the source electrodes 14 other than the paired outside electrodes S1 and S6.

The source electrodes 14 each have a ground potential by being connected to the via holes 22. An appropriate bias voltage is applied to each of the gate electrodes 36 and the drain electrodes 18. Further, a high-frequency signal is input to each of the gate electrodes 36. As a result, a high-frequency signal with high power is generated in each of the drain electrodes 18, and an amplification action can be obtained. Application of the bias voltage from outside to the transistor chip, and input and output of the high-frequency signal are performed through the wires bonded to the gate pad 34 and the drain pad 16.

Figure 4:
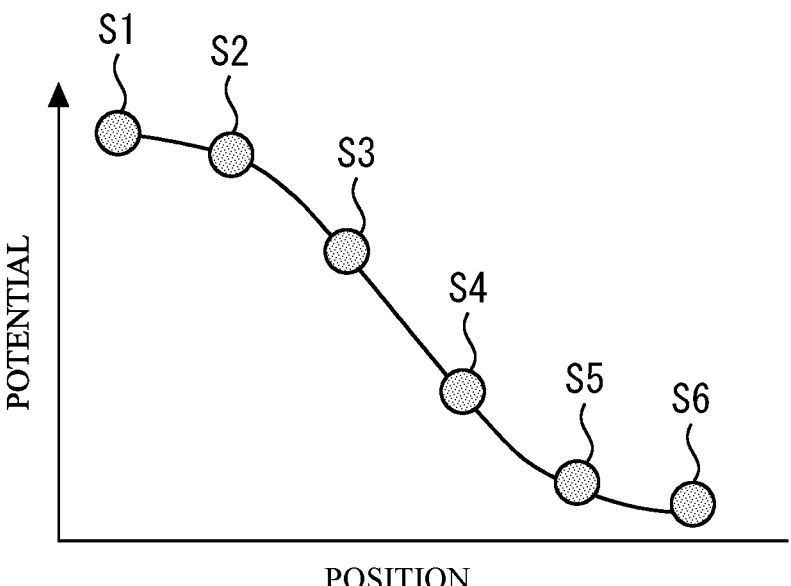
FIG. 4 is a diagram illustrating relationship between the positions of the source electrodes and the potentials at the second ends of the source electrodes.

Next, oscillation that may occur in the transistor 100 in a case where the wires 26 and 30 are not provided is described. FIG. 4 is a diagram illustrating relationship between the positions of the source electrodes 14 and the potentials at the second ends 14a of the source electrodes 14. A vertical axis of FIG. 4 represents the potentials at the second ends 14a of the six source electrodes S1 to S6 when the wires 26 and 30 are not provided. A horizontal axis represents positions of the source electrodes S1 to S6 in the chip.

FIG. 4 illustrates a standing wave of a potential inside the transistor chip at a resonance frequency, namely, at a frequency at which oscillation may occur. Since the source electrodes 14 are connected to the via holes 22, a direct-current potential is fixed to a ground potential. However, the source electrodes 14 each have an inductance. Therefore, potentials at end parts may be varied in a millimeter wave band or a quasi-millimeter wave band. In particular, at the resonance frequency of the transistor chip, the potentials at the end parts may form the standing wave as illustrated in FIG. 4.

In FIG. 4, as an example, a waveform at a moment when the potential at the second end 14a of the source electrode S1 is high and the potential at the second end 14a of the source electrode S6 is low is illustrated. The potential of the source electrode S1 is lowered and the potential of the source electrode S6 is increased over the time, and the potentials are reversed. Such potential variation is periodically repeated. A frequency of the periodic potential variation corresponds to the resonance frequency of the transistor chip. When the transistor has a gain at the resonance frequency in the millimeter wave band or the quasi-millimeter wave band, an amplitude of the voltage variation may be continuously amplified. As a result, a large voltage amplitude may be generated, which may cause oscillation and damage of the transistor. Such oscillation of the single transistor chip easily occurs in the millimeter wave band or the quasi-millimeter wave band.

Figure 5:
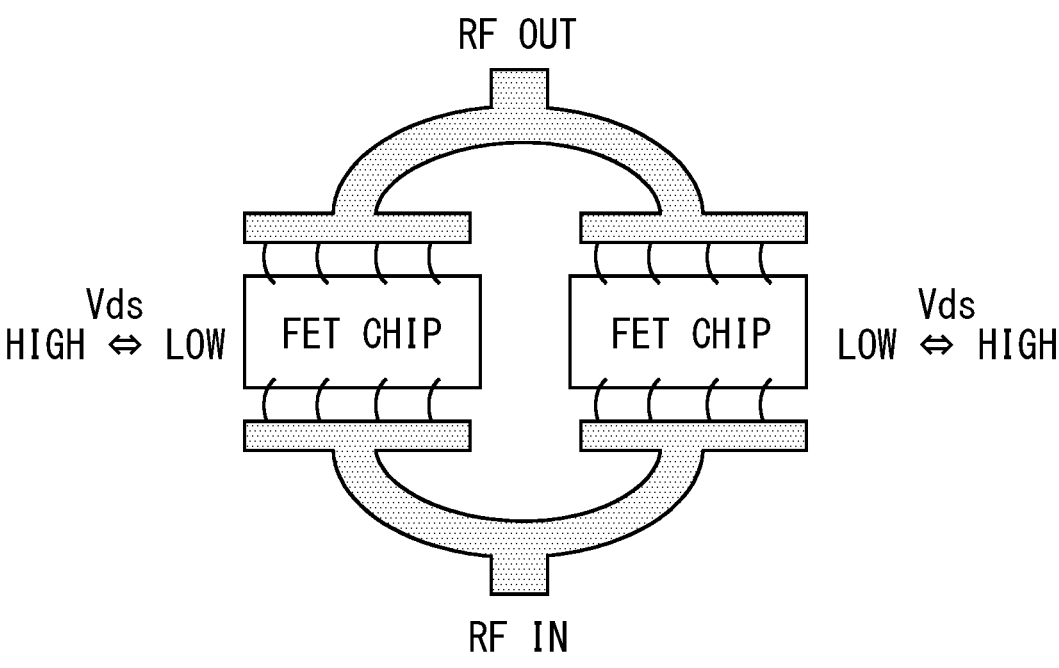
FIG. 5 is a diagram illustrating an amplifier obtained by combining transistor chips in parallel.

FIG. 5 is a diagram illustrating an amplifier obtained by combining transistor chips in parallel. The above-described oscillation occurs based on the principle same as a phenomenon that is called odd-mode oscillation occurring in an amplifier obtained by combining a plurality of transistor chips in parallel. The odd-mode oscillation is oscillation occurring when voltages Vds of the chips connected in parallel are varied in phases opposite to each other.

As an example of a method to suppress the oscillation illustrated in FIG. 4, reduction of the gain of the transistor is considered. However, this runs counter to the demand for increase in gain of the transistor. As another method to suppress the oscillation, prevention of the standing wave of the potentials at the second ends 14a of the source electrodes 14 is considered.

Figure 6:
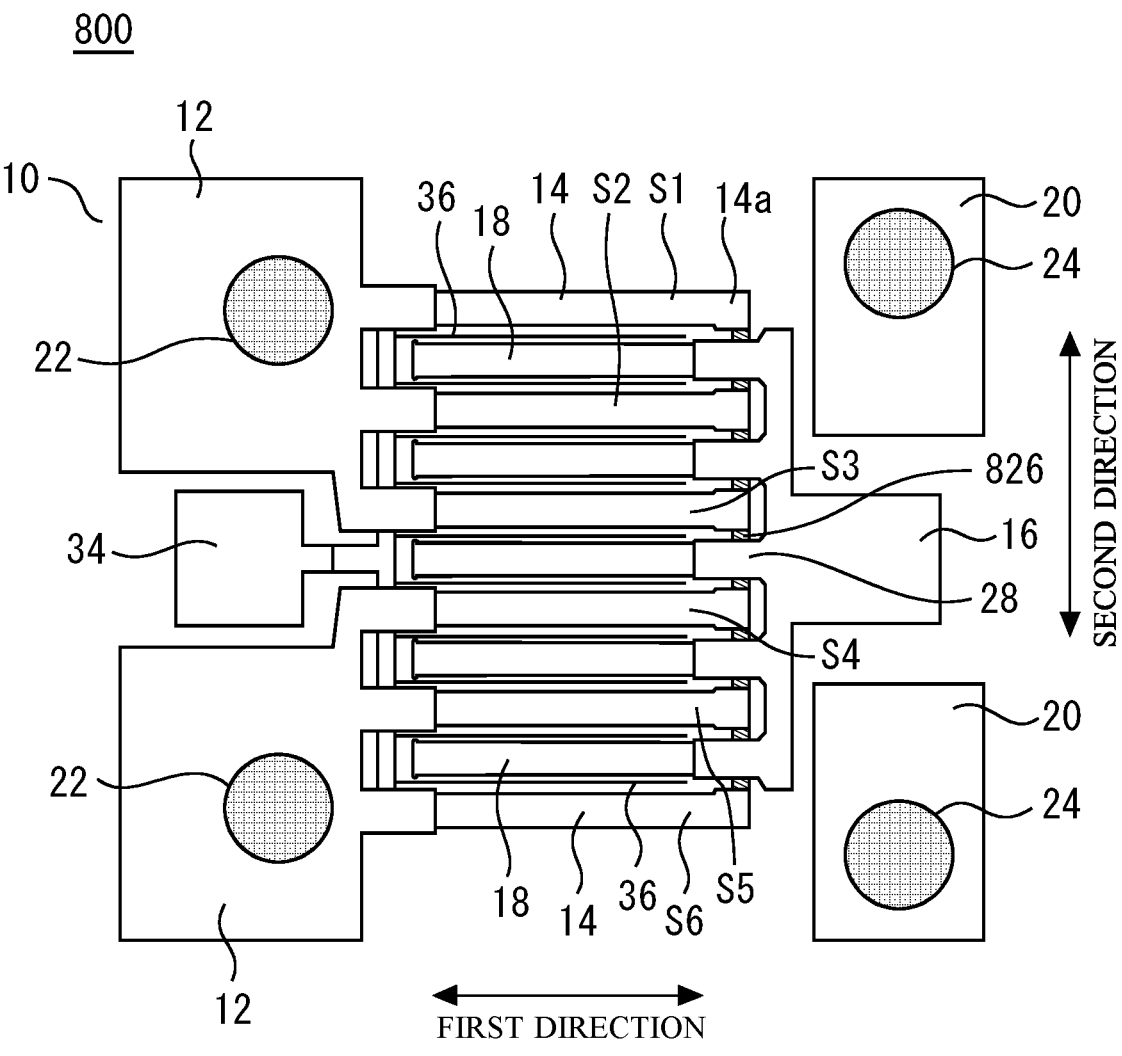
FIG. 6 is a plan view of a transistor according to a comparative example.

FIG. 6 is a plan view of a transistor 800 according to a comparative example. The transistor 800 is different from the transistor 100 in that a wire 826 connects all of the second ends 14a of the source electrodes 14. Further, the wires 30 are not provided in the transistor 800. In the transistor 800, the second ends 14a of the source electrodes 14 are connected to each other by the wire 826, to cause short circuit. As a result, the potential difference among the source electrodes 14 is suppressed, and occurrence of the standing wave can be prevented.

Actually, the source electrodes 14 cannot be ideally short-circuited because of inductance of the wire 826. However, occurrence of the standing wave is prevented by the wire 826, and the resonance frequency of the transistor chip is largely increased. The gain of the transistor is generally reduced as the frequency is increased. Therefore, it is possible to suppress oscillation.

The wire 826 and the air bridge 28 form a parallel plate capacitor. Therefore, the drain-source capacitance is increased. Increase of the drain-source capacitance may cause inconvenience such as narrow band of the operation frequency of the amplifier including the high-frequency transistor. In particular, when surroundings of the high-frequency transistor are filled with a dielectric in order to improve humidity resistance, an electrostatic capacitance at a portion where the wire 826 and the air bridge 28 intersect each other is further increased.

Further, in a case where a matching circuit designed suitably for the high-frequency transistor in order to obtain high power-added efficiency is formed, when filling of the dielectric is performed thereafter, the drain-source capacitance may be varied. As a result, characteristics of the high-frequency transistor may be changed, and sufficient power-added efficiency may not be obtainable.

For the reason described above, it is desirable to reduce an area of a portion where the wire 826 and the air bridge 28 are overlapped. However, reduction of the wire 826 may cause oscillation, and the high-frequency transistor itself may become unusable.

In this case, when only a pair of the source electrodes 14 having a large potential difference is selectively connected, it is expected that the high oscillation suppression effect is obtainable while suppressing the drain-source capacitance. The waveform of the standing wave illustrated in FIG. 4 is a sine curve. Therefore, the pair of adjacent source electrodes 14 having the largest potential difference is the pair of source electrodes S3 and S4 provided at the chip central part. Further, the pair of source electrodes 14 having the largest potential difference among all source electrodes 14 is the pair of source electrodes S1 and S6 at both ends of the chip.

Figure 7:
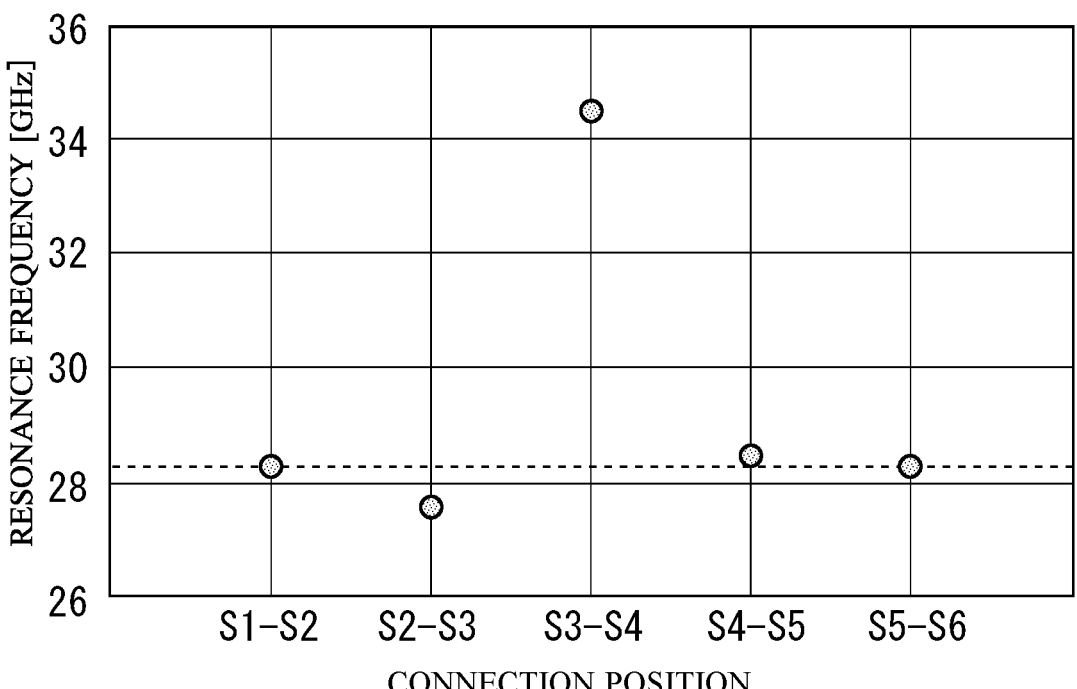
FIG. 7 is a diagram illustrating relationship between a connection position of the source electrodes and the resonance frequency.

FIG. 7 is a diagram illustrating relationship between a connection position of the source electrodes 14 and the resonance frequency. FIG. 7 illustrates a simulation result of the resonance frequency by electromagnetic field analysis when the wires 30 are not provided and only one pair of adjacent source electrodes 14 is connected by the wire 26.

A dashed line illustrated in FIG. 7 indicates a calculation result of the resonance frequency in a case where the second ends 14a of the source electrodes 14 are not connected, and all of the second ends 14a of the source electrodes 14 are in a released state. It was found from the simulation that a high resonance frequency is obtainable when the source electrodes S3 and S4 are connected among five connection position candidates.

Figure 12:
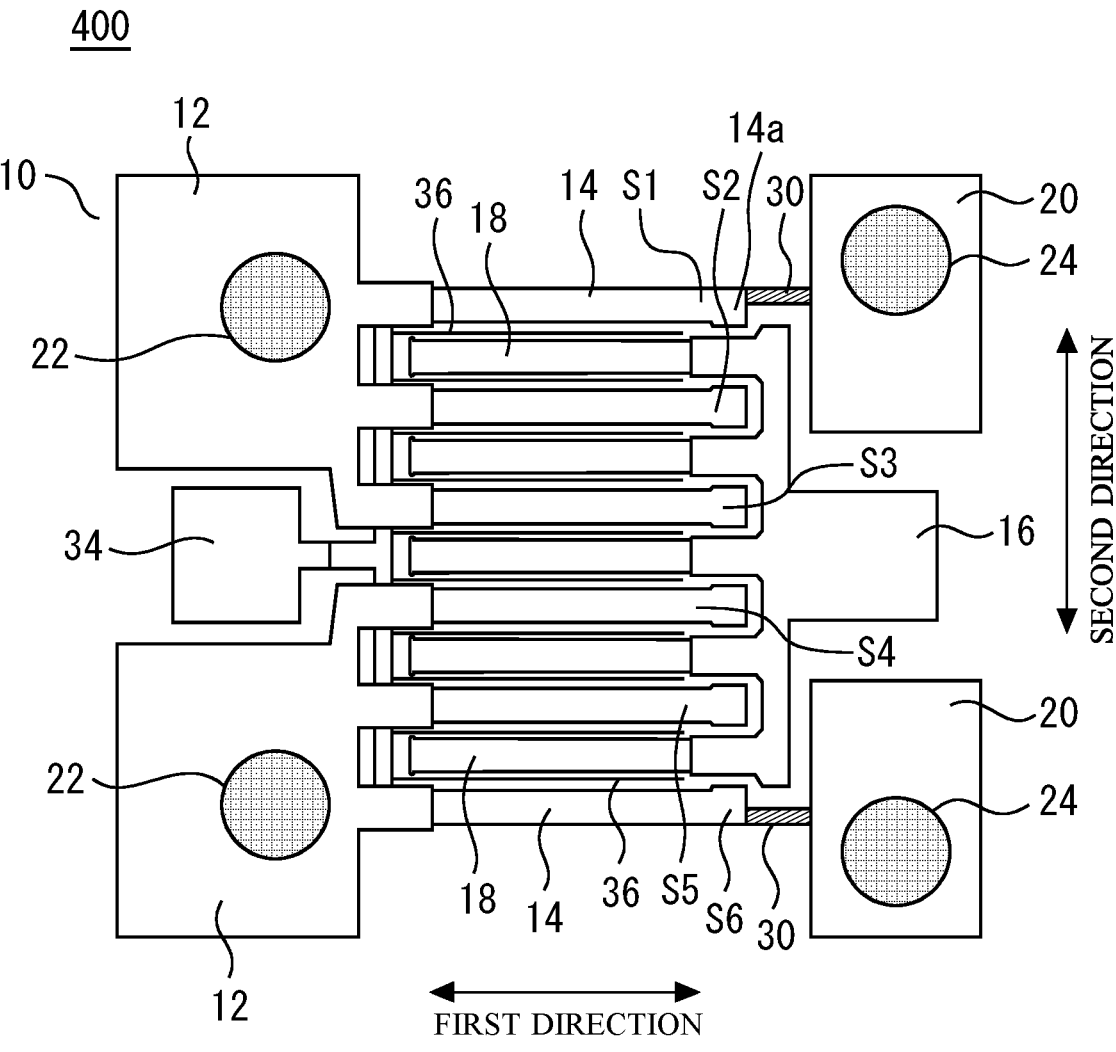
FIG. 12 is a plan view of a transistor according to Embodiment 4.

Further, the resonance frequency when the wire 26 is not provided and the source electrodes S1 and S6 are connected was calculated by the electromagnetic field analysis. In other words, the electromagnetic field analysis was performed by assuming a configuration as illustrated in FIG. 12. At this time, the second end 14a of the source electrode S1 is connected to the second end 14a of the source electrode S6 through the connection path including the wire 30, the via hole 24, the rear surface metal 32, the via hole 24, and the wire 30.

The resonance frequency in a case where the source electrodes S1 and S6 at both ends are not connected, namely, in a case where all of the second ends 14a of the source electrodes 14 are in the released state is 28.3 GHz as illustrated by the dashed line in FIG. 7. In contrast, the resonance frequency when the second ends 14a of the source electrodes S1 and S6 at both ends are connected was calculated as 32.1 GHz. As described above, it was found that the resonance frequency is improved by the configuration illustrated in FIG. 12.

FIG. 8 is a diagram illustrating relationship between connection state of the source electrodes 14 and the resonance frequency. In FIG. 8, source end connection indicates the connection state of the second ends 14a of the source electrodes 14 by the wire 26. In FIG. 8, V/H connection at both chip ends indicates presence/absence of connection of the second ends 14a of the source electrodes S1 and S6 at both ends through the via holes 24.

In the case of the configuration of the transistor 800 in which all of the second ends 14a of the source electrodes 14 are connected, the resonance frequency is estimated as 46.2 GHz, and the highest resonance frequency is obtained. In the case of the configuration in which all of the second ends 14a of the source electrodes 14 are in the released state, the resonance frequency is 28.3 GHz. In contrast, in a case where the second ends 14a of the source electrodes 14 at the chip central part are connected but the V/H connection at both chip ends is absent, the resonance frequency is 34.5 GHz. Further, in a case where the source end connection is absent but the V/H connection at both chip ends is present, the resonance frequency is 32.1 GHz. In other words, the resonance frequency is improved by connection of the second ends 14a of the source electrodes 14 at the chip central part or connection of the second ends 14a of the source electrodes 14 at both chip ends.

Further, as in the transistor 100, when connection of the second ends 14a of the source electrodes 14 at the chip central part and connection of the second ends 14a of the source electrodes 14 at both chip ends are both used, the resonance frequency of about 40 GHz is obtainable.

It should be noted that, when all of the ends of the source electrodes 14 are connected, the resonance frequency is not varied even though the ends of the source electrodes 14 at both ends are further connected to the via holes 24. It was confirmed from both of experiment and calculation that, when the second ends 14a of the source electrodes S1 and S6 at both ends are further connected to the via holes 24 in the state illustrated in FIG. 6, the number of via holes connected to the source electrodes 14 is increased and the source inductance is reduced. However, the resonance frequency and likelihood of occurrence of the oscillation are not changed even though the source inductance is reduced. This is because, when all of the ends of the source electrodes 14 are connected to one another, the ends of the source electrodes S1 and S6 at both ends are also already connected on the upper surface of the semiconductor substrate 10. This indicates that a significant effect is not obtained even when the source electrodes S1 and S6 at both ends are further connected by the via holes 24 and the rear surface metal 32 in this state.

In contrast, it was found that, in the configuration in which all of the ends of the source electrodes 14 are in the released state or in the configuration in which some of the ends of the source electrodes 14 are only connected to one another, the resonance frequency is improved by connecting the ends of the source electrodes S1 and S6 at both ends to the via holes 24.

An increased amount of the drain-source capacitance by arrangement of the wires 26 and 826 relative to the state where all of the second ends 14a of the source electrodes 14 are in the released state was estimated by the electromagnetic field analysis. At this time, the state where the surroundings of the transistor are filled with a common dielectric material was assumed. In the case of the transistor 800 illustrated in FIG. 6, a calculation result that the drain-source capacitance is increased by 49 femtofarads by the wire 826 was obtained. In contrast, in the case of the transistor 100 according to the present embodiment, the increased amount of the drain-source capacitance by the wire 26 was 8 femtofarads.

As described above, the area of the portion where the wire 26 and the air bridge 28 intersect each other is reduced, which makes it possible to suppress the drain-source capacitance. As described above, in the transistor 100 according to the present embodiment, it is possible to suppress the drain-source capacitance while improving the resonance frequency and suppressing oscillation.

Figure 9:
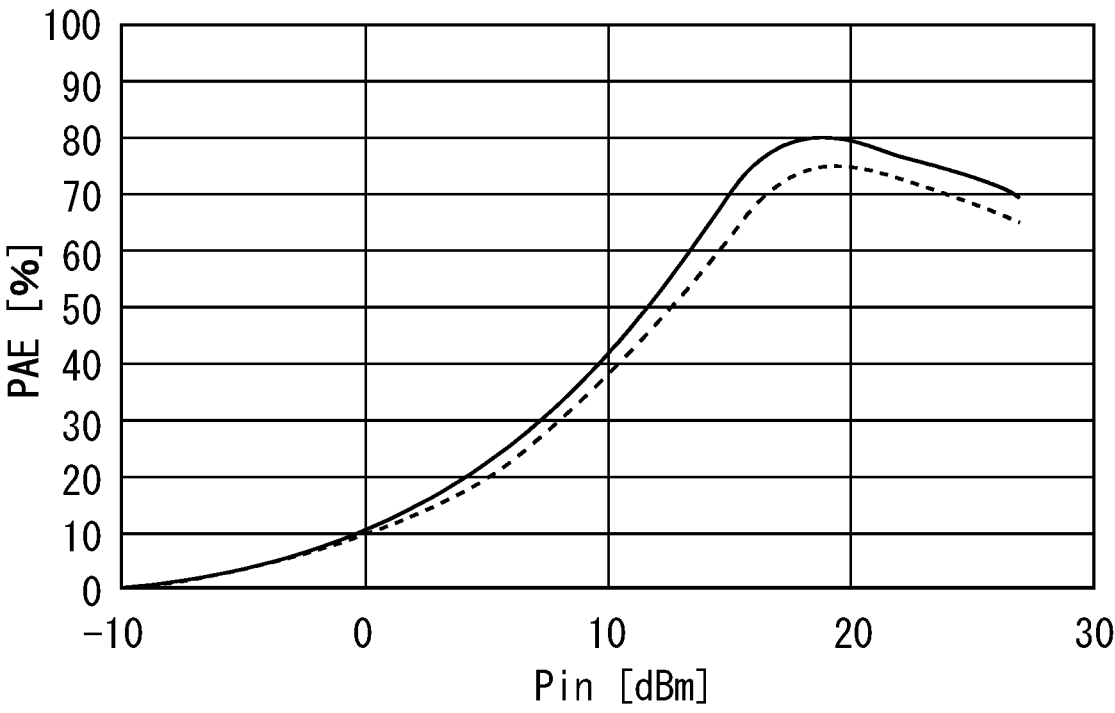
FIG. 9 is a diagram illustrating relationship between input power to the transistor and the power-added efficiency.

FIG. 9 is a diagram illustrating relationship between input power to the transistor 100 and the power-added efficiency. A vertical axis in FIG. 9 represents PAE (Power-Added Efficiency) of the transistor, and a horizontal axis represents power Pin of the high-frequency signal input to the transistor. A dashed line in FIG. 9 indicates a calculation result of the transistor 800, and a solid line indicates a calculation result of the transistor 100. In the case of the transistor 800, when the matching circuit is appropriately designed and created, and the dielectric material is filled thereafter, characteristics of the transistor 800 are changed, and the maximum value of the power-added efficiency is reduced to about 75 percent. In contrast, in the case of the transistor 100 according to the present embodiment, when the drain-source capacity is suppressed, the characteristic change caused by filling of the dielectric material is suppressed, which makes it possible to maintain high power-added efficiency of 80 percent. Accordingly, it is possible to suppress deterioration of performance of the transistor 100.

The configurations of the transistor 100 illustrated in FIG. 1 to FIG. 3 are illustrative. For example, the number of source electrodes 14, the number of drain electrodes 18, and the number of gate electrodes 36 are not limited to the numbers illustrated in FIG. 1. Further, the shape, the position, and the number of each of the source pads 12, the drain pad 16, the gate pad 34, and the electrode pads 20 are not limited. Further, as described below, the plurality of central electrodes may be a plurality of electrode provided at the central part of the semiconductor substrate 10 in the arrangement direction among the plurality of source electrodes 14, and the number of central electrodes may be 3 or more.

These modifications can be applied, as appropriate, to a transistor according to the following embodiments. Note that the transistors according to the following embodiments are similar to those of the embodiment 1 in many respects, and thus differences between the transistors according to the following embodiments and that of the embodiment 1 will be mainly described below.

Embodiment 2

Figure 10:
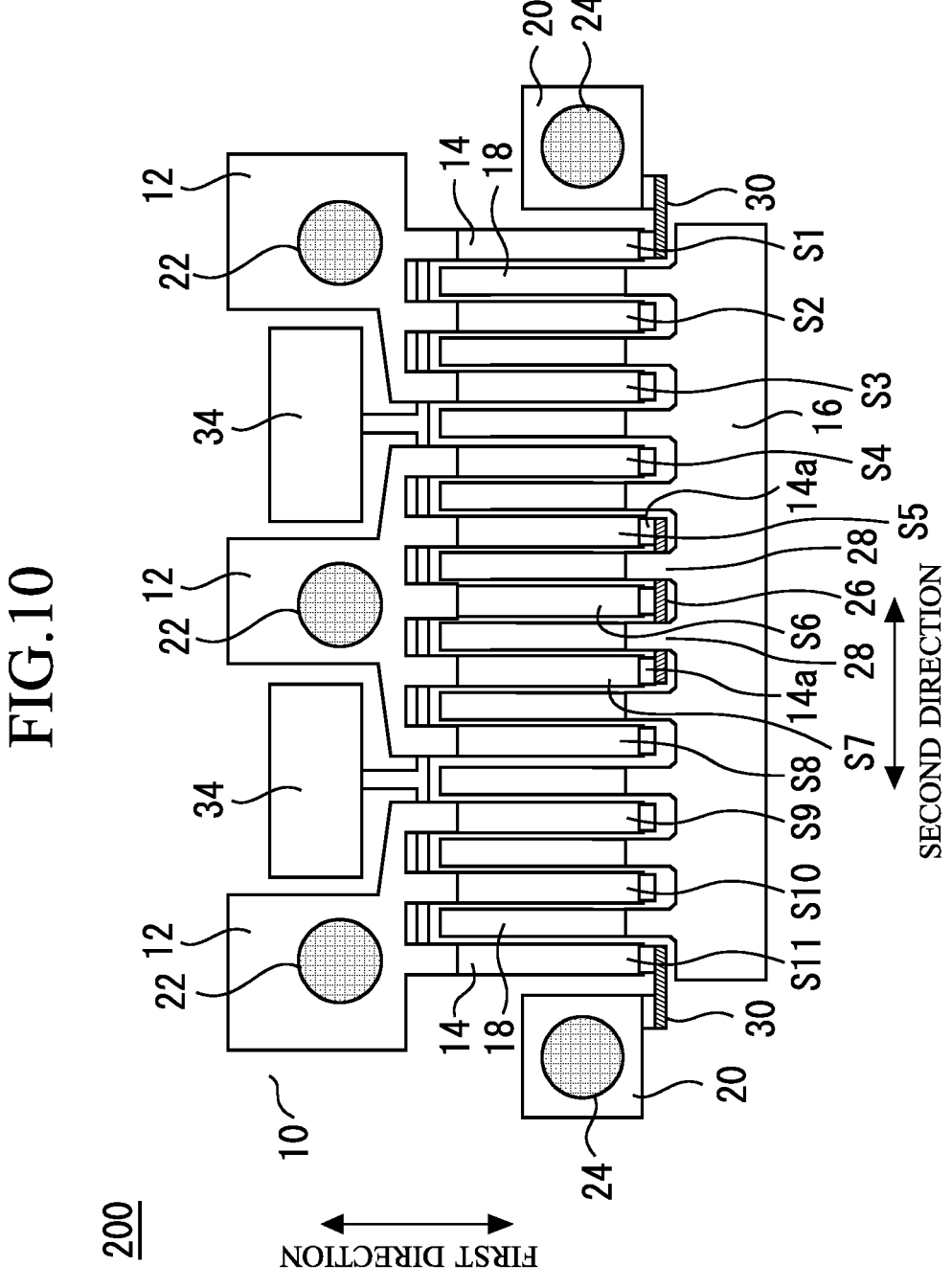
FIG. 10 is a plan view of a transistor according to Embodiment 2.

FIG. 10 is a plan view of a transistor 200 according to Embodiment 2. The transistor 200 includes source electrodes S1 to S11 as the plurality of source electrodes 14. Note that, in FIG. 10, illustrations of the gate electrodes 36 are omitted. In the transistor 200 according to the present embodiment, among the plurality of electrodes including the plurality of source electrodes 14, the plurality of drain electrodes 18, and the plurality of gate electrodes 36 arranged in the second direction, the electrode provided at the center is the source electrode S6. Therefore, the second ends 14a of the source electrode S6 at the center and the source electrodes S5 and S7 adjacent thereto are connected by the wire 26.

In the present embodiment, the standing wave of the potentials at the second ends 14a of the source electrodes 14 also forms a sine curve as illustrated in FIG. 4. Therefore, as in Embodiment 1, the second ends 14a of the plurality of source electrodes S5, S6, and S7 provided at the central part of the semiconductor substrate 10 in the second direction are connected by the wire 26, which makes it possible to improve the resonance frequency and to suppress oscillation.

Embodiment 3

Figure 11:
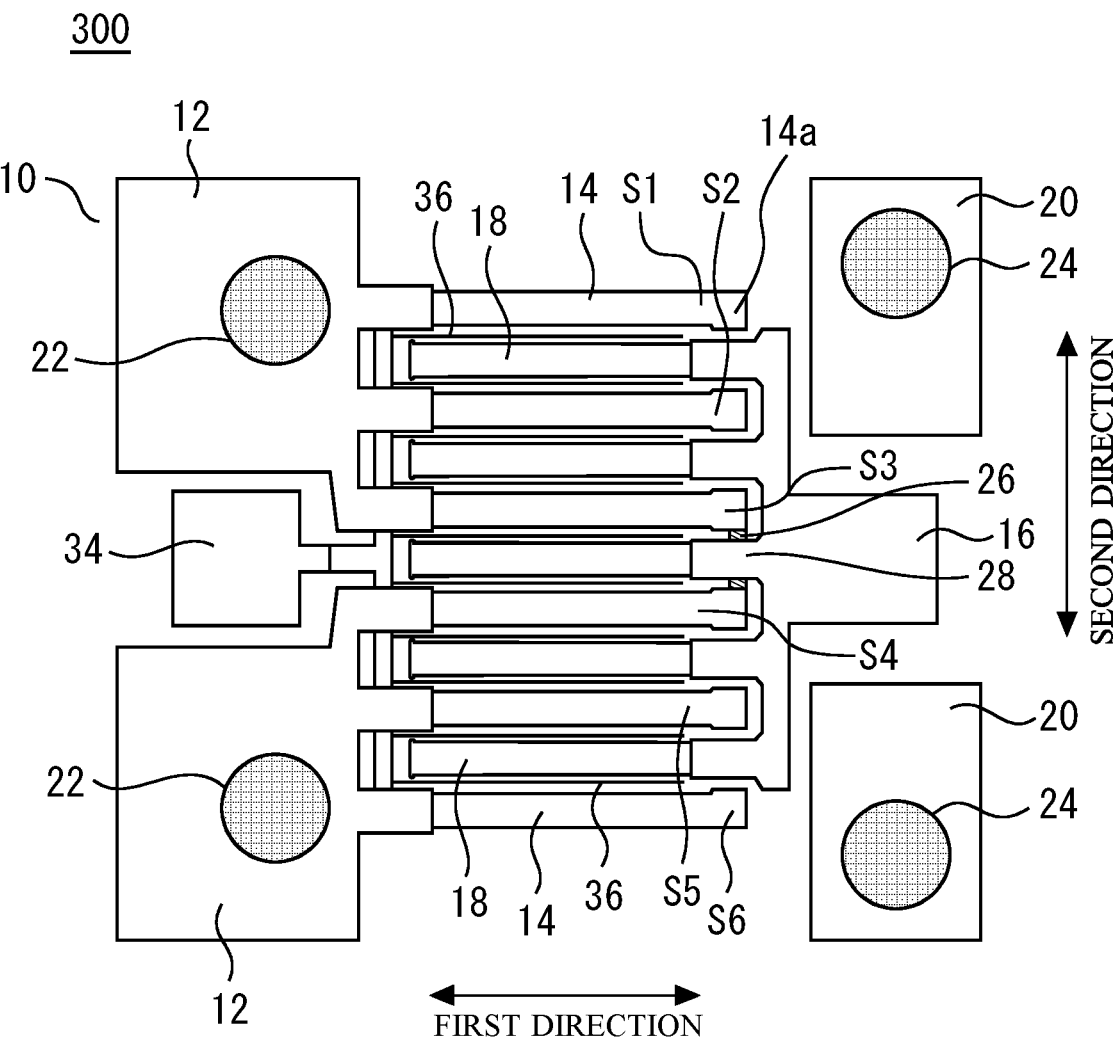
FIG. 11 is a plan view of a transistor according to Embodiment 3.

FIG. 11 is a plan view of a transistor 300 according to Embodiment 3. The transistor 300 is different from the transistor 100 in that the wires 30 are not provided. As illustrated in FIG. 7 and FIG. 8, even when the source electrodes S1 and S6 at both ends are not connected to the via holes 24, it is possible to improve the resonance frequency and to suppress oscillation by connecting the second ends 14a of the source electrodes 14 at the central part to each other. In a case where a gain of the transistor 300 is low, and oscillation can be suppressed only by improvement in resonance frequency by the wire 26, such a structure is adoptable. Further, in a case where connection to the via holes is difficult due to, for example, absent of the via holes near the source electrodes 14 at both chip ends, the structure according to the present embodiment is effective.

Further, in the case where the electrode provided at the center among the plurality of electrodes arranged in the second direction is the source electrode 14 as in Embodiment 2, the second ends 14a of three source electrodes 14 including the source electrode 14 at the center and the source electrodes adjacent thereto may be connected as illustrated in FIG. 10.

Embodiment 4

FIG. 12 is a plan view of a transistor 400 according to Embodiment 4. The transistor 400 is different from the transistor 100 in that the wire 26 is not provided. As illustrated in FIG. 12, even when the second ends 14a of the source electrodes 14 at the chip central part are not connected to each other, it is possible to improve the resonance frequency and to suppress oscillation by connecting the second ends 14a of the source electrodes 14 at both ends to the via holes 24. In a case where a gain of the transistor 400 is low, and oscillation can be suppressed only by connecting the source electrodes 14 at both ends to the via holes 24, such a structure is adoptable.

In particular, when increase in drain-source capacitance caused by intersection of the wire 26 and the air bridge 28 is a concern, the present embodiment is preferably adopted.

Embodiment 5

Figure 13:
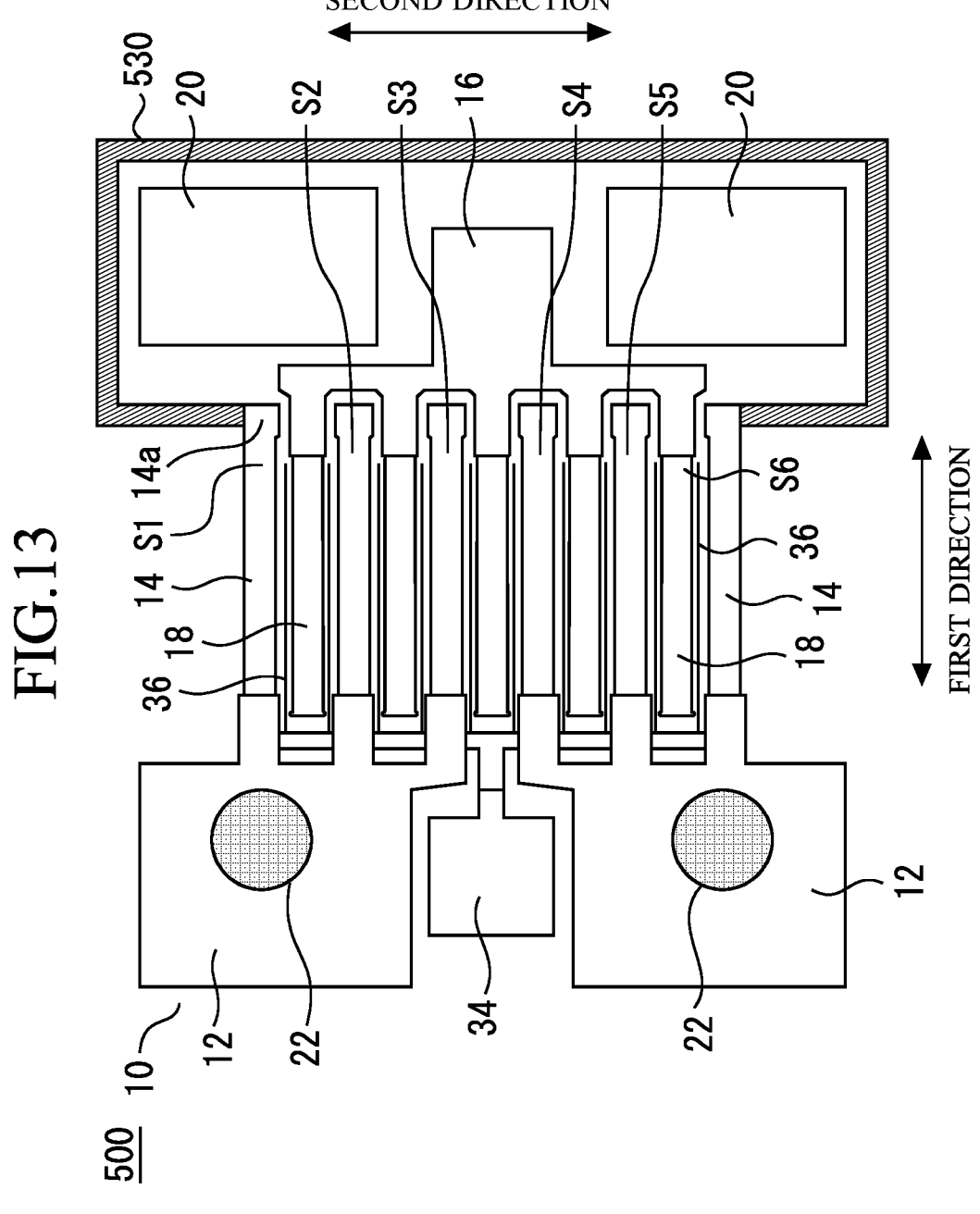
FIG. 13 is a plan view of a transistor according to Embodiment 5.

FIG. 13 is a plan view of a transistor 500 according to Embodiment 5. The transistor 500 is different from the transistor 400 in a connection path connecting the second ends 14a of the paired outside electrodes S1 and S6 provided at both ends in the second direction among the plurality of source electrodes 14. The transistor 500 includes a wire 530 that is provided on the upper surface of the semiconductor substrate 10 and connects the second ends 14a of the paired outside electrodes S1 and S6. The wire 530 is made of a metal.

The wire 530 connects the second ends 14a of the paired outside electrodes S1 and S6 by bypassing the other metal layers provided on the upper surface of the semiconductor substrate 10. The other metal layers include the source pads 12, the drain pad 16, the gate pad 34, the electrode pads 20, the source electrodes 14, the drain electrodes 18, and the gate electrodes 36. In such a configuration, it is possible to improve the resonance frequency and to suppress oscillation.

Further, the wire 530 is not connected to the second ends 14a of the source electrodes 14 other than the paired outside electrodes S1 and S6. Further, the wire 530 passes through a chip periphery. Therefore, it is possible to avoid intersection with the drain electrodes 18, and to avoid formation of the parallel plate capacitor. This makes it possible to suppress the drain-source capacitance while suppressing oscillation. The present embodiment is adoptable, for example, in a case where restriction of the area of the transistor chip is moderate.

The wire 26 may further provided in the transistor 500.

Note that the technical features described in the above embodiments may be combined as appropriate.

REFERENCE SIGNS LIST 10 semiconductor substrate, 12 source pad, 14 source electrode, 14a second end, 16 drain pad, 18 drain electrode, 20 electrode pad, 22 via hole, 24 via hole, 26 wire, 28 air bridge, 30 wire, 32 rear surface metal, 34 gate pad, 36 gate electrode, 100, 200, 300, 400, 500 transistor, 530 wire, 800 transistor, 26 wire, S1~S11 source electrode

The invention claimed is:
1. A transistor, comprising:
a semiconductor substrate;
a source pad provided on an upper surface of the semiconductor substrate;
a plurality of source electrodes provided on the upper surface of the semiconductor substrate and arranged in an arrangement direction parallel to the upper surface of the semiconductor substrate, the plurality of source electrodes each including a first end connected to the source pad and a second end on a side opposite to the source pad;

a plurality of drain electrodes provided on the upper surface of the semiconductor substrate and arranged alternately with the plurality of source electrodes in the arrangement direction;

a gate electrode provided on the upper surface of the semiconductor substrate; and a first wire configured to connect the second ends of a plurality of central electrodes provided at a central part of the semiconductor substrate in the arrangement direction among the plurality of source electrodes, and not to connect the second ends of the source electrodes other than the plurality of central electrodes among the plurality of source electrodes, wherein the second ends of the source electrodes other than the plurality of central electrodes among the plurality of source electrodes are not connected to the second ends of the plurality of central electrodes.

2. The transistor according to claim 1, wherein the plurality of central electrodes are paired source electrodes adjacent to each other provided at the central part of the semiconductor substrate in the arrangement direction among the plurality of source electrodes.

3. The transistor according to claim 1, wherein the first wire intersects, in a planar view, the drain electrode provided between the plurality of central electrodes, among the plurality of drain electrodes.

4. The transistor according to claim 1, further comprising a connection path configured to connect the second ends of paired outside electrodes provided at both ends in the arrangement direction among the plurality of source electrodes, the connection path being not connected to the second ends of the source electrodes other than the paired outside electrodes among the plurality of source electrodes.

5. The transistor according to claim 4, further comprising:

a rear surface metal provided on a rear surface on a side opposite to the upper surface of the semiconductor substrate; and a plurality of first via holes each penetrating the semiconductor substrate from the upper surface to the rear surface, and connected by the rear surface metal on the rear surface side of the semiconductor substrate, wherein the second ends of the paired outside electrodes are connected by the rear surface metal and the plurality of first via holes.

6. The transistor according to claim 4, further comprising a second wire provided on the upper surface of the semiconductor substrate and configured to connect the second ends of the paired outside electrodes.

7. The transistor according to claim 6, wherein the second wire connects the second ends of the paired outside electrodes by bypassing other metal layers provided on the upper surface of the semiconductor substrate.

8. The transistor according to claim 1, further comprising a second via hole configured to connect the source pad and a rear surface metal provided on a rear surface on a side opposite to the upper surface of the semiconductor substrate.

9. A transistor, comprising:

a semiconductor substrate;

a source pad provided on an upper surface of the semiconductor substrate;

a plurality of source electrodes provided on the upper surface of the semiconductor substrate and arranged in an arrangement direction parallel to the upper surface of the semiconductor substrate, the plurality of source electrodes each including a first end connected to the source pad and a second end on a side opposite to the source pad;

a plurality of drain electrodes provided on the upper surface of the semiconductor substrate and arranged alternately with the plurality of source electrodes in the arrangement direction;

a gate electrode provided on the upper surface of the semiconductor substrate; and a connection path configured to connect the second ends of paired outside electrodes provided at both ends in the arrangement direction among the plurality of source electrodes, and not to connect the second ends of the source electrodes other than the paired outside electrodes among the plurality of source electrodes, wherein the second ends of the source electrodes other than the paired outside electrodes among the plurality of source electrodes are not connected to the second ends of paired outside electrodes.

10. The transistor according to claim 9, further comprising:

a rear surface metal provided on a rear surface on a side opposite to the upper surface of the semiconductor substrate; and a plurality of first via holes each penetrating the semiconductor substrate from the upper surface to the rear surface, and connected by the rear surface metal on the rear surface side of the semiconductor substrate, wherein the second ends of the paired outside electrodes are connected by the rear surface metal and the plurality of first via holes.

11. The transistor according to claim 9, further comprising a second wire provided on the upper surface of the semiconductor substrate and configured to connect the second ends of the paired outside electrodes.

12. The transistor according to claim 11, wherein the second wire connects the second ends of the paired outside electrodes by bypassing other metal layers provided on the upper surface of the semiconductor substrate.

13. The transistor according to claim 9, further comprising a second via hole configured to connect the source pad and a rear surface metal provided on a rear surface on a side opposite to the upper surface of the semiconductor substrate.

14. A transistor, comprising:

a semiconductor substrate;

a source pad provided on an upper surface of the semiconductor substrate;

a plurality of source electrodes provided on the upper surface of the semiconductor substrate and arranged in an arrangement direction parallel to the upper surface of the semiconductor substrate, the plurality of source electrodes each including a first end connected to the source pad and a second end on a side opposite to the source pad;

a plurality of drain electrodes provided on the upper surface of the semiconductor substrate and arranged alternately with the plurality of source electrodes in the arrangement direction;

a gate electrode provided on the upper surface of the semiconductor substrate;

a first wire configured to connect the second ends of a plurality of central electrodes provided at a central part of the semiconductor substrate in the arrangement direction among the plurality of source electrodes, and not to connect the second ends of the source electrodes other than the plurality of central electrodes among the plurality of source electrodes;

a connection path configured to connect the second ends of paired outside electrodes provided at both ends in the arrangement direction among the plurality of source electrodes, the connection path being not connected to the second ends of the source electrodes other than the paired outside electrodes among the plurality of source electrodes;

a rear surface metal provided on a rear surface on a side opposite to the upper surface of the semiconductor substrate; and a plurality of first via holes each penetrating the semiconductor substrate from the upper surface to the rear surface, and connected by the rear surface metal on the rear surface side of the semiconductor substrate, wherein the second ends of the paired outside electrodes are connected by the rear surface metal and the plurality of first via holes.

\* \* \* \* \*